(12) United States Patent
Mukherjee et al.

(10) Patent No.: US 6,696,358 B2
(45) Date of Patent: Feb. 24, 2004

(54) VISCOUS PROTECTIVE OVERLAYERS FOR PLANARIZATION OF INTEGRATED CIRCUITS

(75) Inventors: Shyama Mukherjee, Morgan Hill, CA (US); Joseph Levert, Vista, CA (US); Donald Debear, San Jose, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/768,439

(22) Filed: Jan. 23, 2001

(65) Prior Publication Data

US 2002/0096770 A1 Jul. 25, 2002

(51) Int. Cl.$^7$ .......................................... H01L 21/4763
(52) U.S. Cl. ...................... 438/622; 438/697; 438/626
(58) Field of Search ............................ 438/622, 633, 438/693, 692, 118, 626, 631, 634, 697, 725

(56) References Cited

U.S. PATENT DOCUMENTS

| 5,173,130 A | * | 12/1992 | Kinoshita et al. | ........... 438/697 |
| 6,146,991 A | | 11/2000 | Cheng et al. | ............... 438/622 |
| 6,280,644 B1 | * | 8/2001 | Martin et al. | ............... 438/622 |

OTHER PUBLICATIONS

J. Levert, S. Mukherjee, D. DeBear, and M. Fury entitled, "A Novel Spin–Etch Planarization Process for Dual–Damascene Copper Interconnects", Oct. 19, 1999, 12 Pages.

J. Levert, S. Mukherjee, D. DeBear entitled, "SEMI Technology Symposium 99 Proceedings", Dec. 1999, 10 Pages.

* cited by examiner

Primary Examiner—Wael Fahmy
Assistant Examiner—Hoa B. Trinh
(74) Attorney, Agent, or Firm—Bingham McCutchen; Sandra P. Thompson (57) ABSTRACT

The present invention relates to the planarization of surfaces as typically encountered in the fabrication of integrated circuits, particularly copper conductors and Ta/TaN barrier layers encountered in damascene and dual damascene interconnects. The present invention describes planarization methods for Cu/Ta/TaN interconnects, typically making use of a viscous overlayer tending to dwell in regions of lower surface topography, protecting said lower regions from etching by a combination of chemical and mechanical effects. In some embodiments, the viscous overlayer contains species that hinder removal of copper from regions of the surface in contact with the viscous layer. Such species may be a substantially saturated solution of copper ions among other additives, thereby hindering the dissolution of interconnect copper into the protective overlayer. In some embodiments of the present invention, the viscous overlayer may be added prior to the introduction of etchant to the wafer surface, or both etchant and viscous overlayer may be introduced substantially simultaneously, typically as the wafer is spun during planarization.

6 Claims, 9 Drawing Sheets

VISCOUS PROTECTIVE OVERLAYERS FOR PLANARIZATION OF INTEGRATED CIRCUITS

BACKGROUND OF THE INVENTION

1. Technical Field

The present invention relates to the planarization of surfaces during the fabrication of integrated circuits and to viscous protective overlayers retarding etching of depressed surface regions. More particularly, the present invention relates to the planarization of copper surfaces and tantalum/tantalum nitride barrier layers, and to the use of viscous overlayers facilitating planarization and mitigating dishing that typically occurs in the planarization of large copper damascene and dual damascene features.

2. Description of Related Art

Increasing the performance of integrated circuits ("ICs") typically calls for increasing the density of components on the wafer and increasing the speed at which the IC performs its functions. Increasing component density typically requires decreasing the size of the conducting trenches and vias ("interconnects") on the wafer. However, decreasing the cross-section of a current-carrying conductor increases the electrical resistance for the same conducting material, degrading circuit performance and increasing the heating of the interconnects. Present IC technology typically makes use of tungsten (W) and aluminum (Al) interconnects and/or alloys containing these materials. Both metals, Al and W, and typical alloys thereof have adequate electrical conductivity for use in present devices, but future generations of ICs will preferably make use of higher conductivity materials. Copper (Cu) is among the leading candidates.

While Cu has the advantage of higher conductivity than current IC interconnect materials, it suffers from several disadvantages. Cu is a very diffusive contaminant, diffusing easily and widely through other materials typically used in the fabrication of ICs, seriously degrading IC performance in so doing. Tantalum (Ta) and tantalum nitride (TaN) have been identified as promising barrier materials or "liners" that may be deposited prior to Cu deposition, thereby hindering the diffusion of Cu into the surrounding material. A recent review of copper IC interconnect and other microelectronic technology is given by Shyam P. Murarka, Igor V. Verner and Ronald J. Gutmann in *Copper—Fundamental Mechanisms for Microelectronic Applications,* (John Wiley, 2000).

Planarization is a necessary step in the fabrication of multilayer ICs, providing a flat, smooth surface that can be patterned and etched with the accuracy required of modern IC components. The conventional planarization technique is CMP (Chemical Mechanical Planarization) known in the art and described in text books (for example, *Chemical Mechanical Planarization of Microelectronic Materials,* by Joseph M. Steigerwald, Shyam P. Murarka and Ronald J. Gutman, 1997). CMP makes use of a polishing pad brought into mechanical contact with the wafer to be planarized with an abrasive slurry interposed between polishing pad and wafer. Relative motion (typically rotation) of the polishing pad with respect to the wafer leads to polishing of the wafer through mechanical abrasion and chemical etching caused by suitable reactive chemicals contained in the etching solution. Non-contact planarization has also been proposed in which effectively no mechanical abrasion occurs on the wafer, planarizing by means of chemical effects. One such non-contact planarization techniques makes use of a spinning wafer and suitable etching chemicals ("spin-etch planarization") and is described in application Ser. No. 09/356,487 (incorporated herein by reference). Some aspects of non-contact planarization have been reported by J. Levert, S. Mukherjee and D. DeBear "Spin-Etch Planarization Process for Copper Damascene Interconnects" in *Proceedings of SEMI Technology Symposium* 99, Dec. 1–3, 1999, pp. 4–73 to 4–82. See also J. Levert, S. Mukherjee, D. DeBear and M. Fury "A Novel Spin-Etch Planarization Process for Dual-Damascene Copper Interconnects" in *Electrochemical Society Conference, October* 1999, p. 162 ff. And see also, Shyama P. Mukherjee, Joseph A. Levert and Donald S. DeBear, "Planarization of Copper Damascene Interconnects by Spin-Etch Process: A Chemical Approach," MRS Spring Meeting, San Francisco, Calif., Apr. 27, 2000 including the references cited in all of the foregoing.

Other copper planarization procedures include that of Moslehi (WO 99/14800) and electrochemical or electropolishing techniques described by Cantolini and co-workers (J. Electrochem. Soc. Vol. 141, No. 9, pp. 2503–2510, September 1994 and WO 92/07118).

The present invention relates to improved methods for the planarization of Cu/Ta/TaN layers in the fabrication of ICs. The present invention may be employed in connection with spin-etch planarization, conventional CMP or other planarization techniques that are apparent to those having ordinary skills in the art.

BRIEF SUMMARY OF THE INVENTION

The present invention relates to the planarization of surfaces as typically encountered in the fabrication of integrated circuits, particularly copper conductors and Ta/TaN barrier layers encountered in damascene and dual damascene interconnects. To be definite in our discussion, we consider an example of considerable current technological interest, the planarization of copper surfaces and Ta/TaN barrier layers. Application of the invention disclosed herein to the planarization of other systems will be apparent to those having ordinary skills in the art.

Following deposition of the copper layer, surface topography in the upper surface of copper layer is to be removed by the planarization process, resulting in a substantially planar conductor co-planar with the surrounding dielectric. "Dishing" relates to the tendency to form a concave region in the copper interconnect lying below the plane of the dielectric surface. Dishing is a problem typically most pronounced in the planarization of large interconnects.

The present invention describes planarization methods for Cu/Ta/TaN interconnects, typically making use of a viscous overlayer tending to dwell in regions of lower surface topography, protecting said lower regions from etching by a combination of chemical and mechanical effects. Simultaneously, the raised less-protected regions of surface topography are preferentially removed. In some embodiments, the viscous overlayer contains species that hinder removal of copper from regions of the surface in contact with the viscous layer. Such species may be a substantially saturated solution of copper ions, thereby hindering the dissolution of interconnect copper into the protective overlayer. Other species inhibiting or passivating the copper surface from dissolution may be included in the viscous overlayer, including quinolines or benzotriazol among others. In some embodiments of the present invention, the viscous overlayer may be added prior to the introduction of etchant to the wafer surface, or both etchant and viscous overlayer may be introduced substantially simultaneously, typically as the wafer is spun during planarization. One embodiment relates to a method of planarizing a metal surface in the fabrication of integrated circuit interconnects comprising introducing a protecting fluid onto said metal surface and dispersing said protecting fluid across said metal surface and introducing an etching solution onto said metal surface, whereby the viscosity of said protecting fluid exceeds that of said etching solution thereby hindering etching of said surface in regions of said surface occupied by said protecting layer and etching said metal surface to planarity.

BRIEF DESCRIPTION OF THE DRAWINGS

The drawings herein are schematic and not to scale.

FIG. 3: Schematic cross-sectional view of typical damascene and dual damascene interconnect (A) prior to planarization. (B) After removal of field copper and exposing field barrier layer for an ideal planarization process. (C) After complete planarization for an ideal planarization process. (D) After complete planarization following a conventional (non-ideal) planarization process.

FIG. 4: Schematic cross-sectional view of typical damascene and dual damascene interconnects with surface topography prior to planarization including applications of viscous overlayer. (A) Complete coverage. (B) Partial coverage.

DETAILED DESCRIPTION OF THE INVENTION

In the following description and figures, similar reference numbers are used to identify similar elements. The drawings presented herein are schematic and not drawn to scale.

Many variations of the damascene and dual damascene processes are known in the art. For example, see *Copper— Fundamental Mechanisms for Microelectronic Applications* (supra), pp. 265–311 and references cited therein, (incorporated herein by reference). The examples of damascene and dual damascene processes presented herein are illustrative only and not intended to limit the scope or applicability of the present invention.

Figure 1:
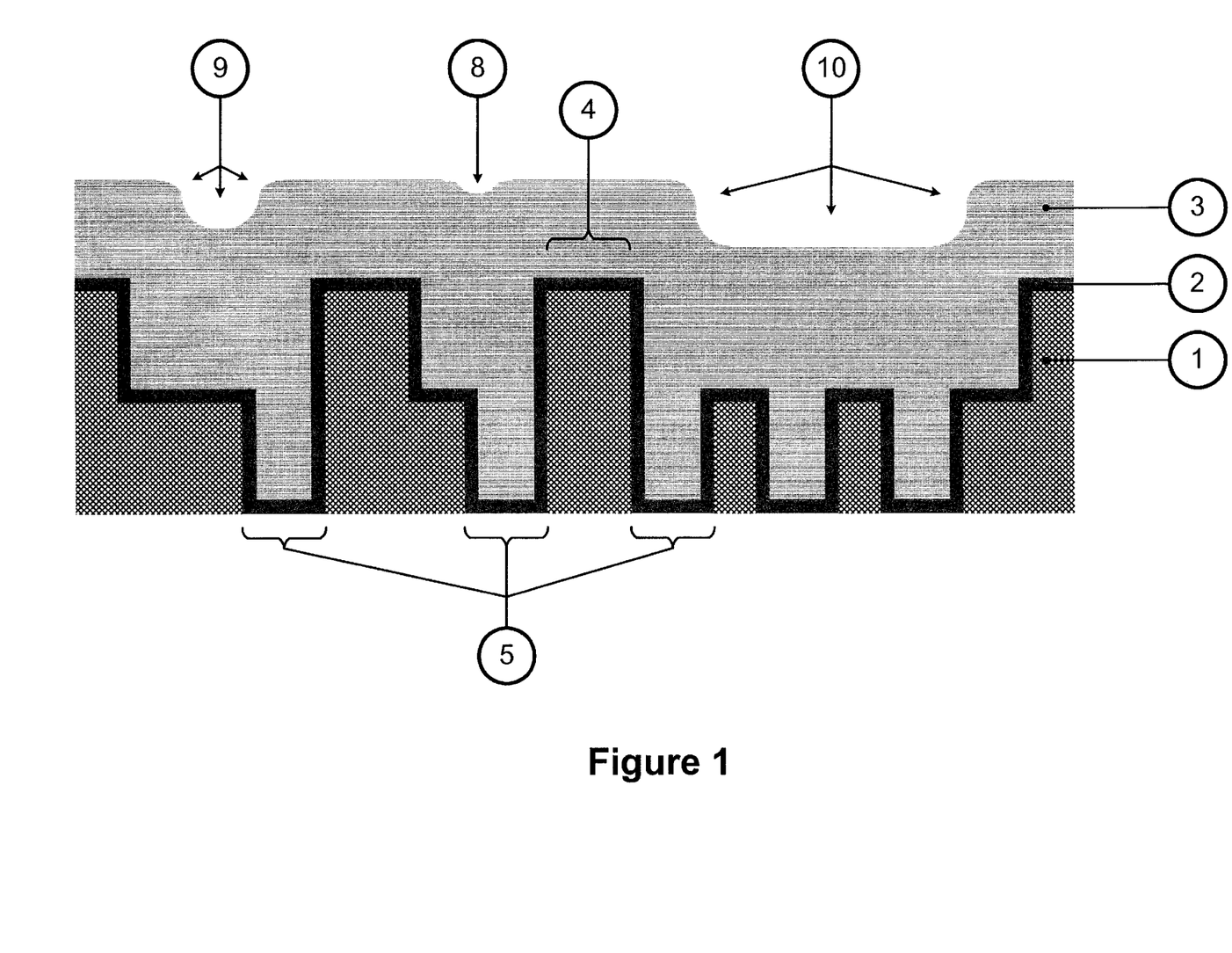
FIG. 1: Schematic, cross-sectional view of typical damascene and dual damascene interconnects prior to planarization.

FIG. 1 depicts a cross-sectional view of a typical damascene metal interconnection structure ("interconnect") before planarization. An insulating dielectric layer, 1, (typically called an "interlayer dielectric" or ILD) is patterned, typically by means of photolithography, plasma etching among other techniques. A barrier layer, 2, is typically deposited on the patterned dielectric followed by deposition of the conductor, 3. Typical barrier layers are typically tantalum/tantalum nitride ("Ta/TaN"), 2, for use with copper conductors, 3. In order to be concrete in our description, we describe the particular example related to the planarization of copper interconnects with a Ta/TaN barrier layer, not intending thereby to limit the scope of the present invention. Modifications or extensions to other systems are apparent to those having ordinary skills in the art and are included within its scope.

Figure 2:
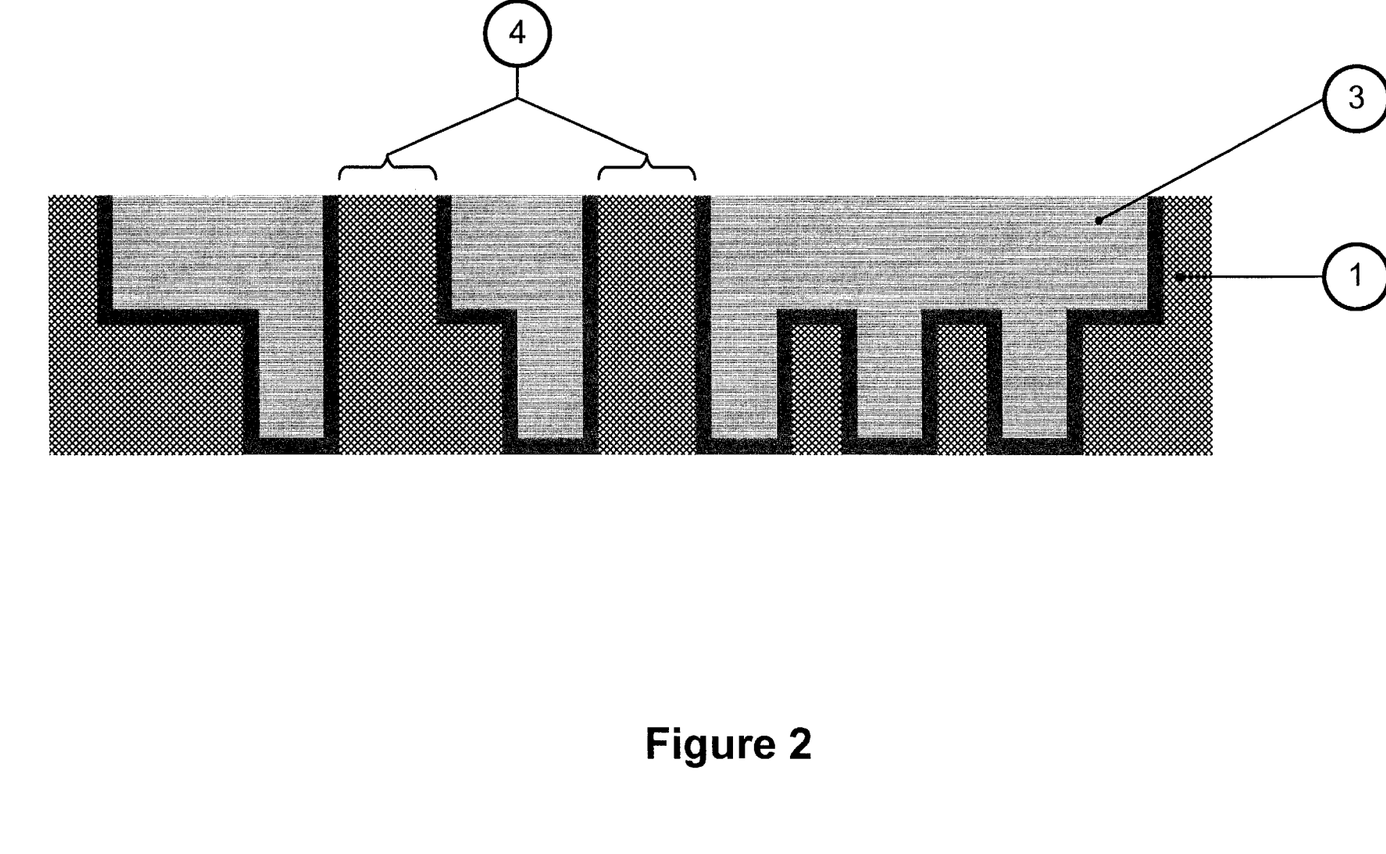
FIG. 2: Schematic, cross-sectional view of typical damascene and dual damascene interconnects following ideal planarization process.

In practice, typical means for depositing the metal layer, 3, (electrodeposition, CVD, PVD, among others) do not fill the features precisely to the lip or form a conductor surface coplanar with the dielectric. Thus, the common approach is that depicted in FIG. 1 in which the conductor, 3, fills the interconnect features such as vias and trenches, 5, as well as coats the flat "field" regions 4, between features leading to a metal layer overlying the entire dielectric surface. Typically the coating process results in non-planar surface topography of the copper layer because of the variation of the size of the underlying ILD features being coated. The surface structure is depicted as 8, 9 and 10. Subsequent processing results in the copper material and barrier layer being removed so as to form an interconnect surface ideally coplanar with the surface of dielectric, 1, suitable for further deposit of material and patterning among other processing steps. FIG. 2 depicts the ideal result of planarization in which all copper and barrier layer material is removed from field regions, 4, and the upper surface of copper conductor, 3, is flat and level with the upper surface of the ILD, 1.

Figure 3A:
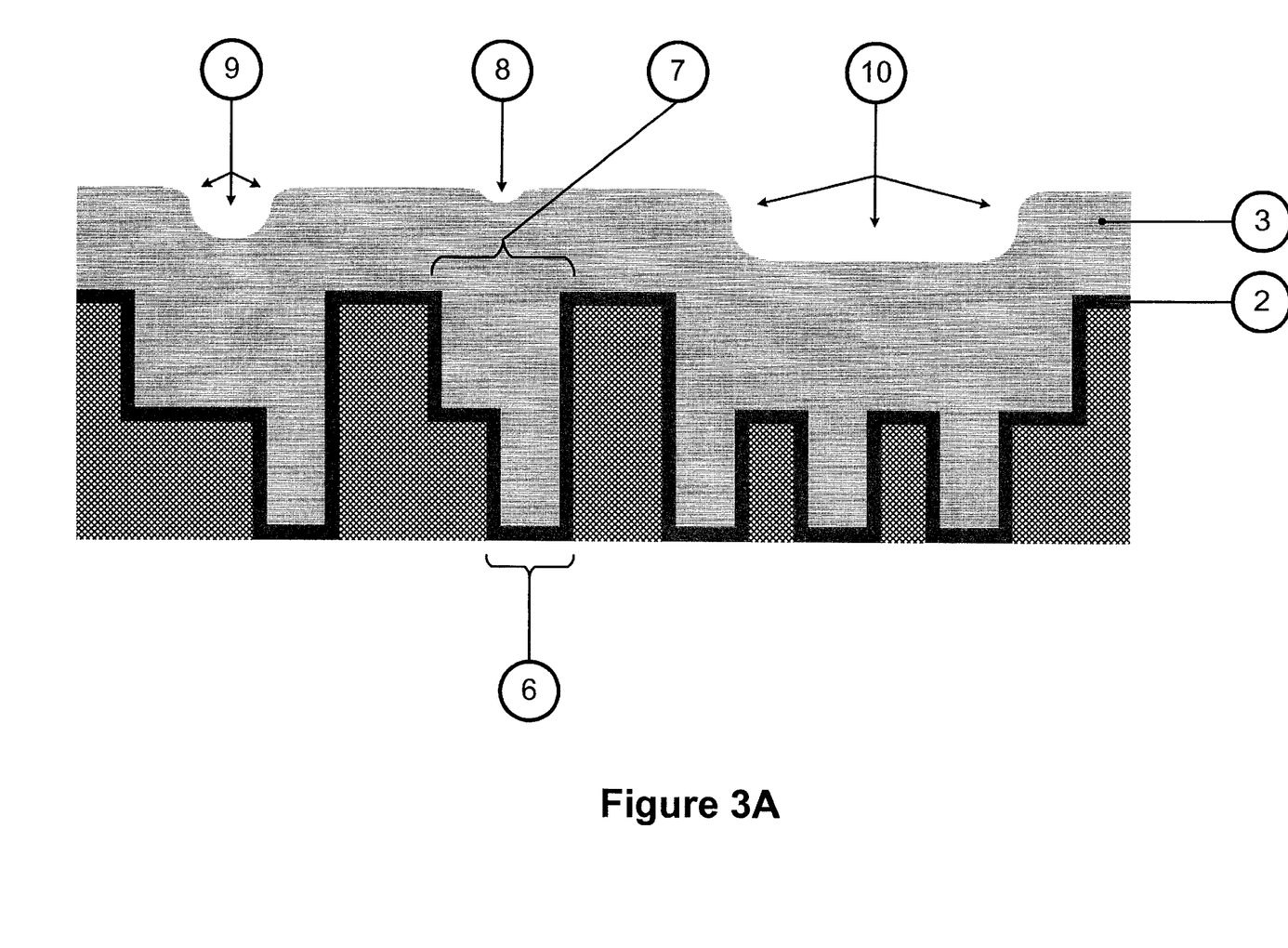

FIG. 3A depicts a typical dual damascene feature following patterning, deposition of the barrier layer and deposition of the metal layer in the feature and on the field regions. Via, 6, trench, 7, are coated with barrier layer, 2, and filled with copper, 3, typically resulting in surface topography, 20, reflective of the underlying trench and via structures.

Figure 3B:
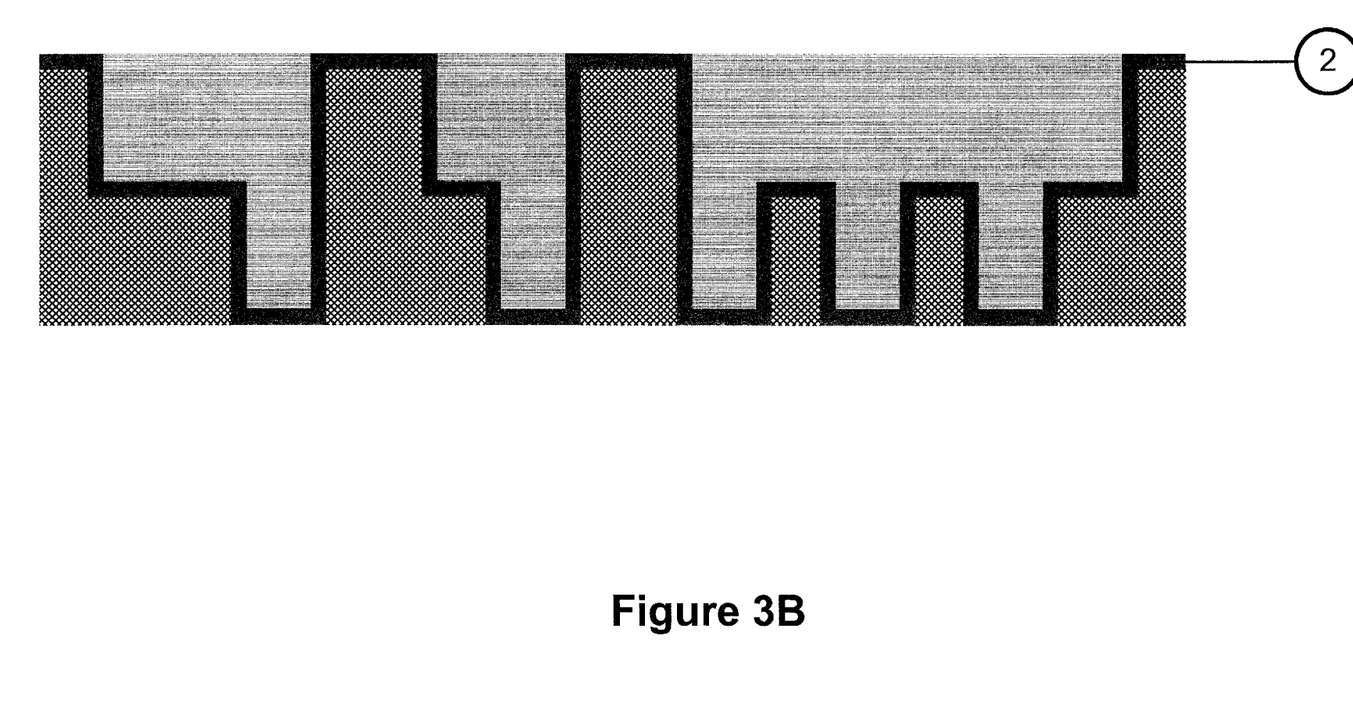

The first step in planarization of either damascene or dual damascene interconnects is the removal of the metal above the field and feature regions, exposing the barrier layer in the field regions. Ideally, the field metal is removed in a planar manner until the upper surface of the metal in the feature is coplanar with the surrounding field. One embodiment depicted in FIG. 3B shows the field metal removed until coplanarity with the field barrier layer, 2, is achieved. Some metal removal procedures remove the metal in a different fashion than the barrier layer, leading to the exposed barrier layer on the field regions depicted in FIG. 3B. Some metal removal procedures use the barrier layer as an "etch stop" indicating the end point of the copper field planarization step. Typically, a copper removal process that does not remove the barrier layer (or removes the barrier layer at a much slower rate than the copper layer) will effectively terminate on the field regions when the barrier layer has been exposed. However, unless the etchant is rapidly removed when the barrier layer is exposed, etching will continue in the copper feature, leading to a concave structure in the upper surface of the copper within the feature ("dishing"). Reduction or avoidance of dishing is one object of the present invention.

Figure 3C:
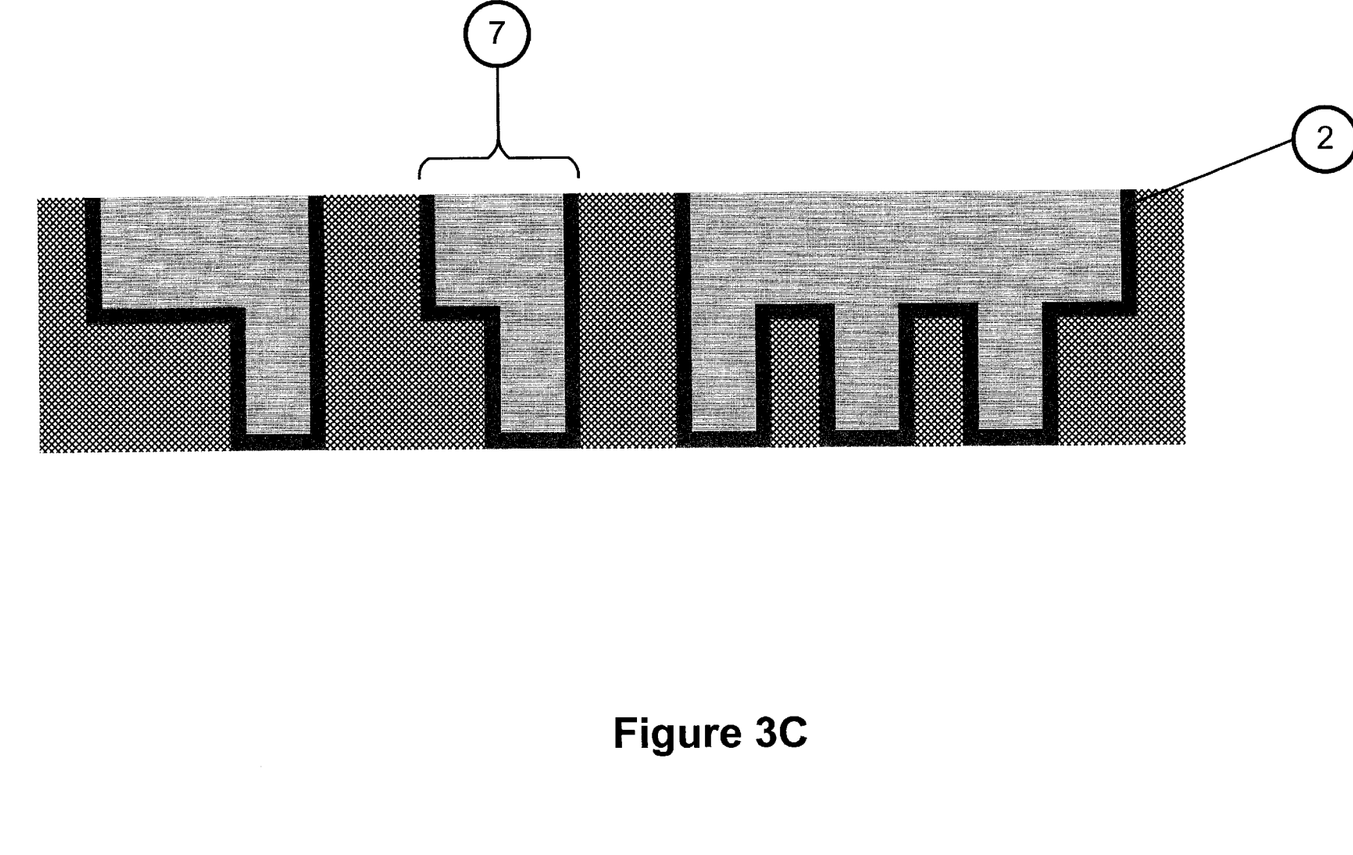

Following exposure of the barrier layer, depicted in FIG. 3B, the barrier layer is typically removed by subsequent planarization along with the removal of sufficient metal to retain coplanarity of the metal-filled feature and dielectric, as depicted in FIG. 3C. If the planarization procedure achieves substantially a 1:1 selectivity in the removal of barrier material and copper, then direct planarization from FIG. 3A to FIG. 3C may be accomplished in one step.

The creation of damascene and dual damascene interconnects by procedures that result in structures similar to those depicted in FIGS. 1, 2, 3B and 3C, is an idealization infrequently realized in practice. Practical planarization of copper damascene and dual damascene interconnects involves several challenges, two of which are the primary concern of the present invention; surface topography and dishing.

Surface Topography

FIG. 1 depicts schematically (and not to scale) a cross-sectional view of one type of imperfection that may occur in the deposition of copper over patterned dielectric (typically with a barrier layer, 2, interposed between copper, 3, and dielectric, 1). Copper may tend to plate or deposit approximately conformally, tending to reproduce in the surface of the copper layer the larger features of the underlying topography. Thus, the depressions characteristic of larger features, typically trenches, may appear as depressed surface topography, 9 and 10, in the copper surface. However, even smaller features including vias may show some surface topography, 8. This uneven structure of the copper surface is to be removed in the planarization processes, indicating that planarization is preferably not a conformal removal of material. That is, the copper removal process must preferentially remove material from elevated regions of an uneven surface to achieve planarization. Conventional CMP involves the application of mechanical forces in addition to chemical removal of material. Mechanical forces tend to be larger on the raised portions of the surface that project into closer proximity with the polishing pad, leading to higher rates of material removal at the raised portions. Non-contact chemical etching requires other modes by which preferential removal of raised topographic features occur, resulting in planarization. Recent developments in spin-etch planarization make use of diffusion controlled reactions, balanced oxidation-reduction reactions, self-galvanic microcouples and/or etch-controlling additives to achieve planarity as described in Ser. No. 09/356,487 which is incorporated herein by reference. Thus, one challenge to be met in achieving effective planarization of copper interconnects is to effectively smooth the surface topography while removing metal.

Dishing

FIG. 3A depicts a cross-sectional view of a typical dual damascene interconnect structure including trench and via prior to planarization. Surface topography, 8, 9 and 10, resulting from conformal-like plating may also be present in dual damascene interconnects. We omit this additional effect to simplify our description by focusing on dishing. In general, both dishing and surface topography will be present and both effects will need to be taken into account simultaneously in the design of an effective, practical planarization procedure.

Perfect planarization removes copper until the upper surface of the feature, 7, is co-planar with the upper surface of the barrier layer on the field region. The ideal planarization will remove the barrier layer, 2, at the same rate as the copper layer, that is substantially 1 to 1 selectivity. Thus, a one-step planarization can be used removing both the copper layer and the barrier layer in a single processing step. The ideal result would be as depicted in FIG. 3C, for a process in which surface topography does not effect planarization and the etching is halted as soon as the barrier layer is removed and co-planarity with ILD, 1, has occurred. However, this ideal situation is not often achieved in practice. Traditional planarization of the interconnect of FIG. 3A may remove copper in the interior region of the feature, resulting in a dish-like geometry depicted as 11 in FIG. 3D. Dishing is a common undesirable side-effect of removing the field region copper, 4, and the barrier layer, 2, overlying the field region.

Figure 3D:
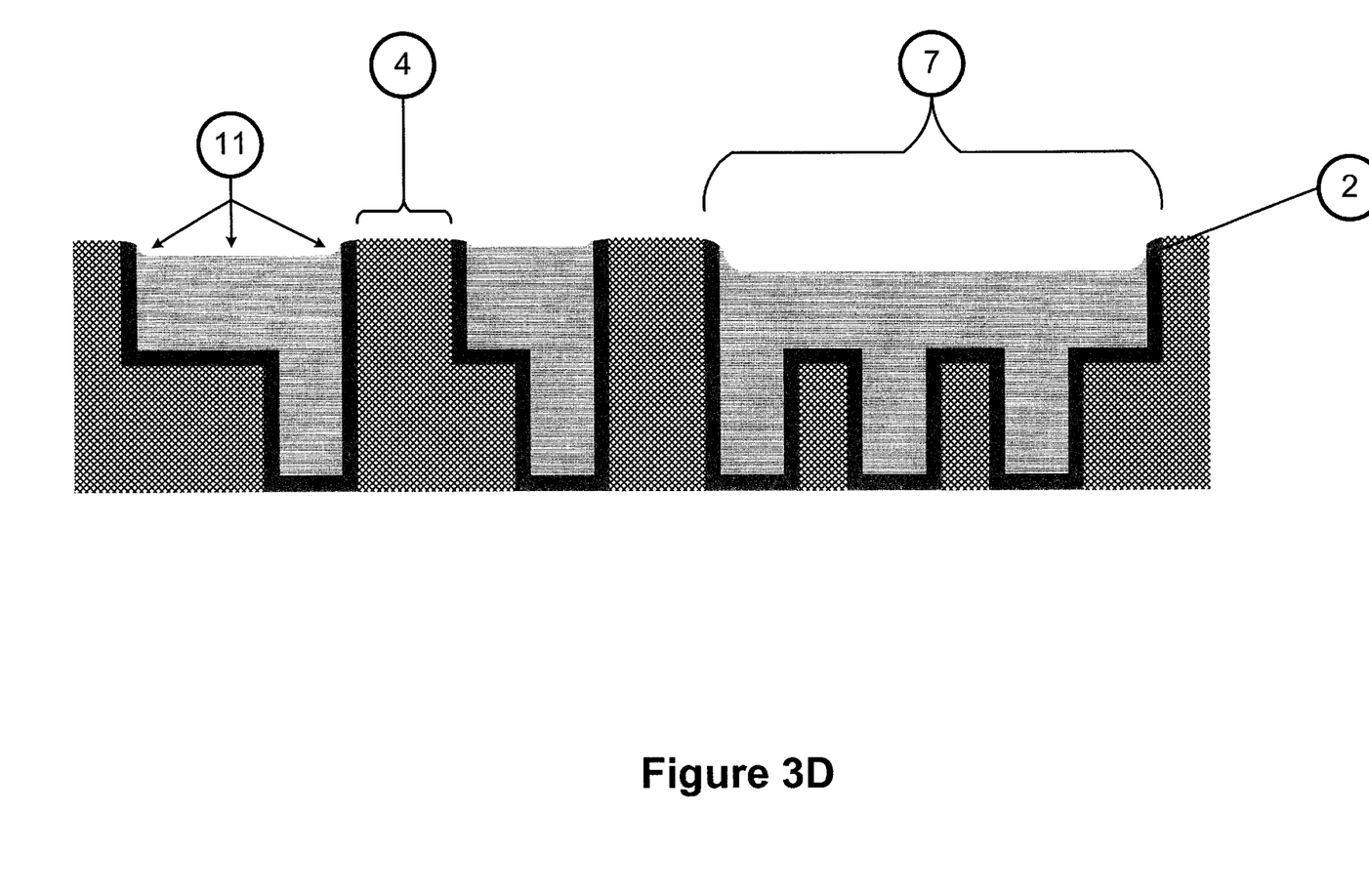

However, the barrier layer is typically Ta,/TaN and fairly aggressive etchants are required to remove it. A two-step planarization process may be employed in which a first set of etchants removes copper and other etchants remove the barrier layer. The use of such etchants often results in a faster rate of copper removal if such etchants are applied to unprotected Cu surfaces. Dishing depicted as 11 is the unwanted result. It should be noted that dishing tends to be a more serious problem for larger features, typically feature dimension, 10, exceeding approximately 10 $\mu$m (10 microns). Modern integrated circuit technology may wish to planarize feature dimensions as large as, or exceeding, 50 $\mu$m, making dishing a serious practical problem.

If planarization is performed by means of a two-step process, copper removal followed by barrier material removal, several factors need to be considered. The chemistry employed in the first step should be capable of chemical polishing or removal of copper selectively. In this instance, the uniformity of copper removal over the entire surface undergoing planarization is important in avoiding dishing. If some of the copper regions are cleared of copper (to the barrier layer or coplanar with the barrier layer), while other areas are not cleared, dishing of the copper in the cleared areas is expected when the residual copper is removed from the uncleaned area. Thus, there are two general causes of dishing: 1) Non-uniformity of copper removal in the first removal step. 2) Preferential etching or polishing of large features at a higher rate than smaller features.

The present invention provides several embodiments for planarization of copper damascene or dual damascene interconnects that reduce or eliminate the problems of dishing. In addition, the several embodiments of the present invention are capable of planarizing copper surfaces having surface topography deriving from conformal-like plating (FIG. 1). Different embodiments offer different advantages in different processing environments.

Viscous Protective Overlayer

Figure 4A:
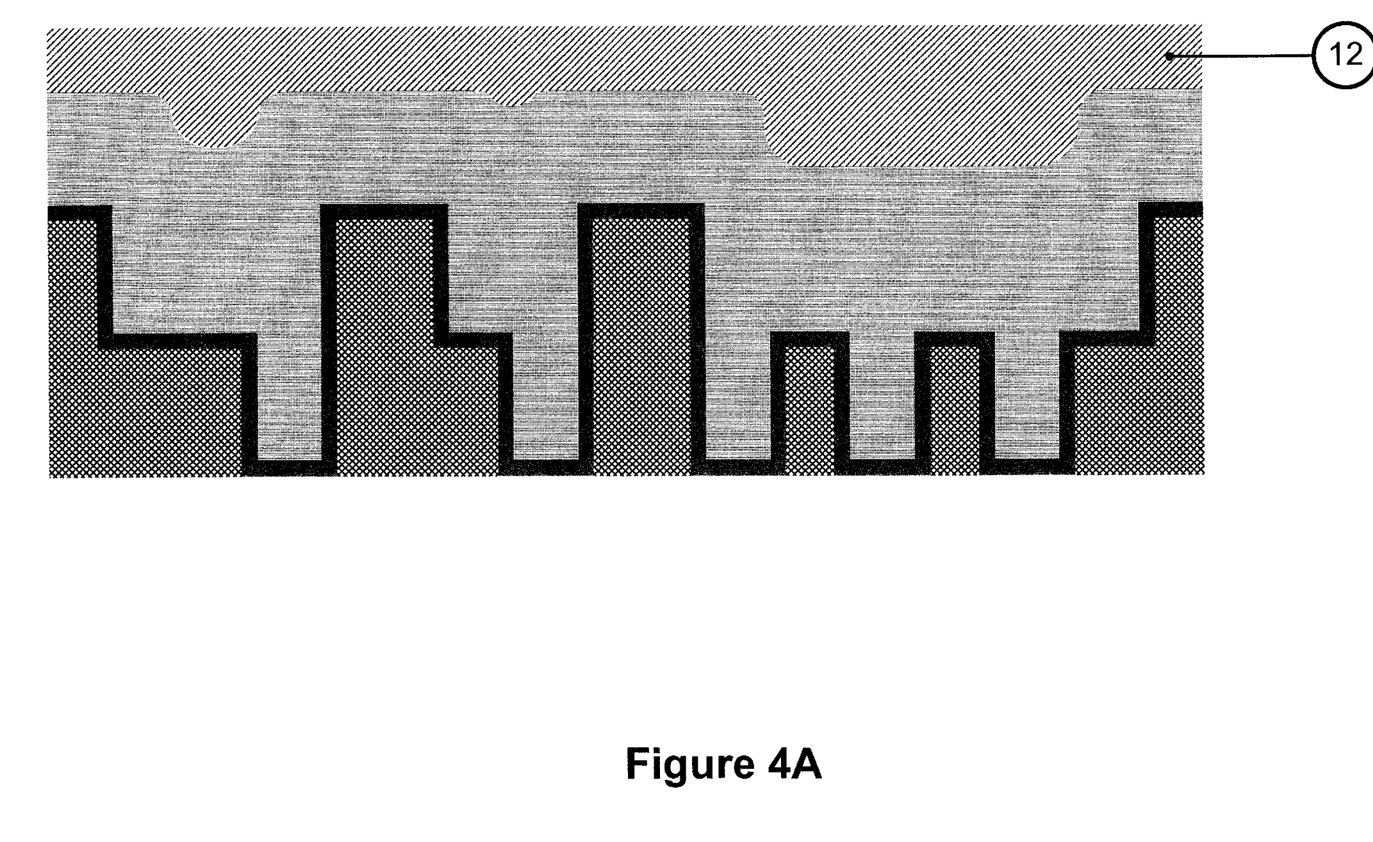
Figure 4B:
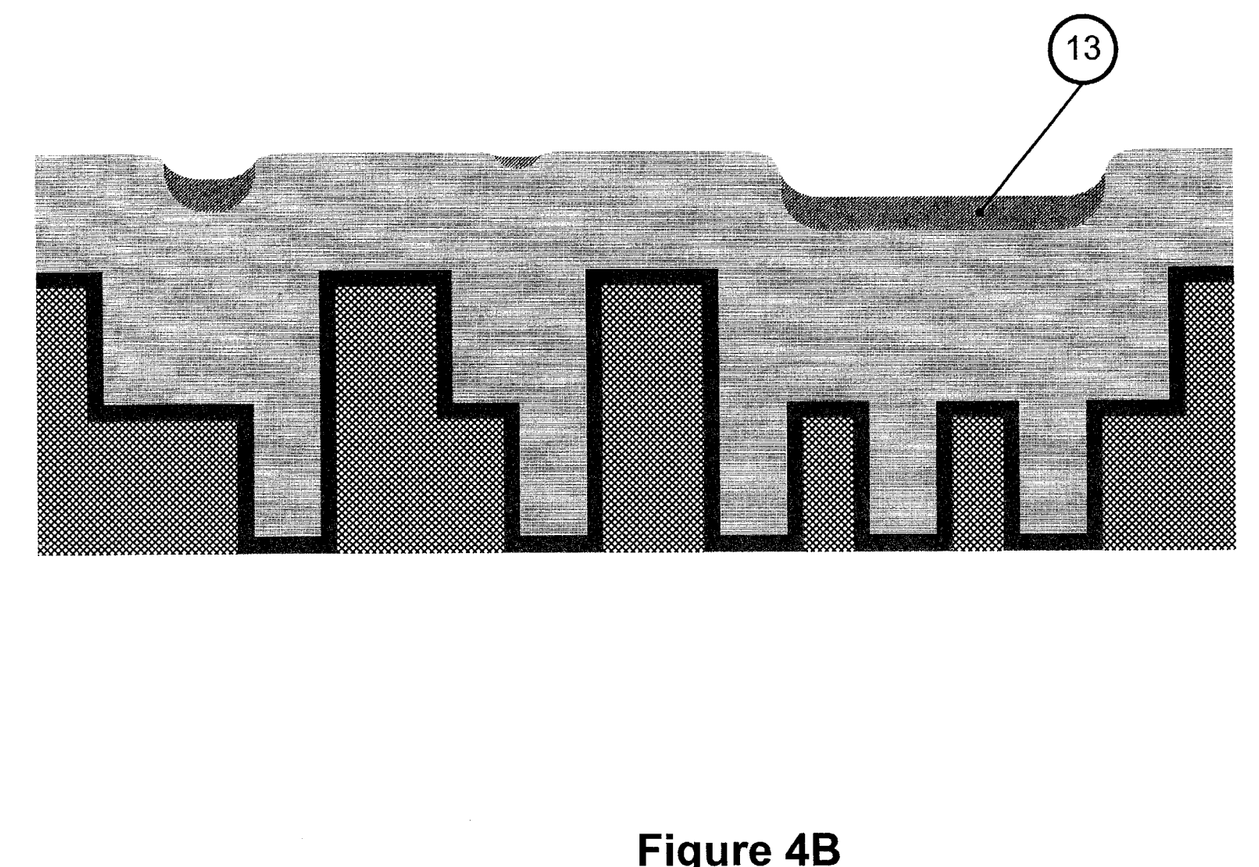

Planarization of a non-uniform metal surface (FIG. 1, for example) requires preferential etching of raised portions of the surface. Some embodiments of the present invention utilize a protective or passivating overlayer in the form of a viscous fluid overlayer preferentially saturated with passivating metal, copper or other chemically inhibiting compounds. "Protecting fluid" as used herein denotes an overlayer on the surface tending to prevent or retard etching of the surface region(s) so covered. One embodiment depicts the viscous fluid schematically 13 in FIG. 4B. A viscous fluid, 13, is deposited onto the surface (typically by spinning, dispersing on the surface, 12) and tends to collect in the depressed regions as depicted by 13 in FIG. 4B and having a substantially planar upper surface thereof The presence of the viscous fluid tending to concentrate in the lower surface regions retards etching from that portion of the surface by means of the overlayer thus produced shielding the lower regions from attack by the etchant as well as retarding metal removal by having inhibiting layer incorporated in close proximity to the metal surface (typically incorporating no oxidants). One embodiment of this inhibiting layer is a viscous layer saturated with passivating metal or copper ions, or other substances known to inhibit the removal of copper in the presence of etchants. Examples of inhibitors include quinolines, benzotriazol among others.

In general, the viscous fluid will form into a gradient without a sharp boundary between the viscous fluid and the etching reagent. However, choosing the protective layer to have a larger (or substantially larger) viscosity than the etchant will nevertheless result in preferential concentration of the viscous fluid in lower surface regions and retarded rates of metal removal. The use of a viscous overlayer is effectively practiced in connection with a non-contact planarization such as spin-etch planarization as described in patent application Ser. No. 09/356,487 in which the spinning of the wafer results in centrifugal forces more easily dispersing the etchant than the viscous protective fluid.

In some embodiments of the present invention for protecting a copper interconnect surface, a viscous solution saturated with copper ions is prepared, typically in the form of copper phosphate for use with etchants containing phosphoric acid. One convenient choice in the practice of the present invention is to use a solution of phosphoric acid in which a copper salt is dissolved, typically copper phosphate, nitrate, acetate or copper alkoxides among others. Such a solution may have a density of around 1.75 and lack oxidants. This viscous solution is typically spin-deposited onto the surface and preferentially retards etching in lower surface regions. The saturation of the overlayer with copper phosphate (or other copper salts as convenient with other etchants) hinders further dissolution of cooper from the surface undergoing planarization.

Figure 5:
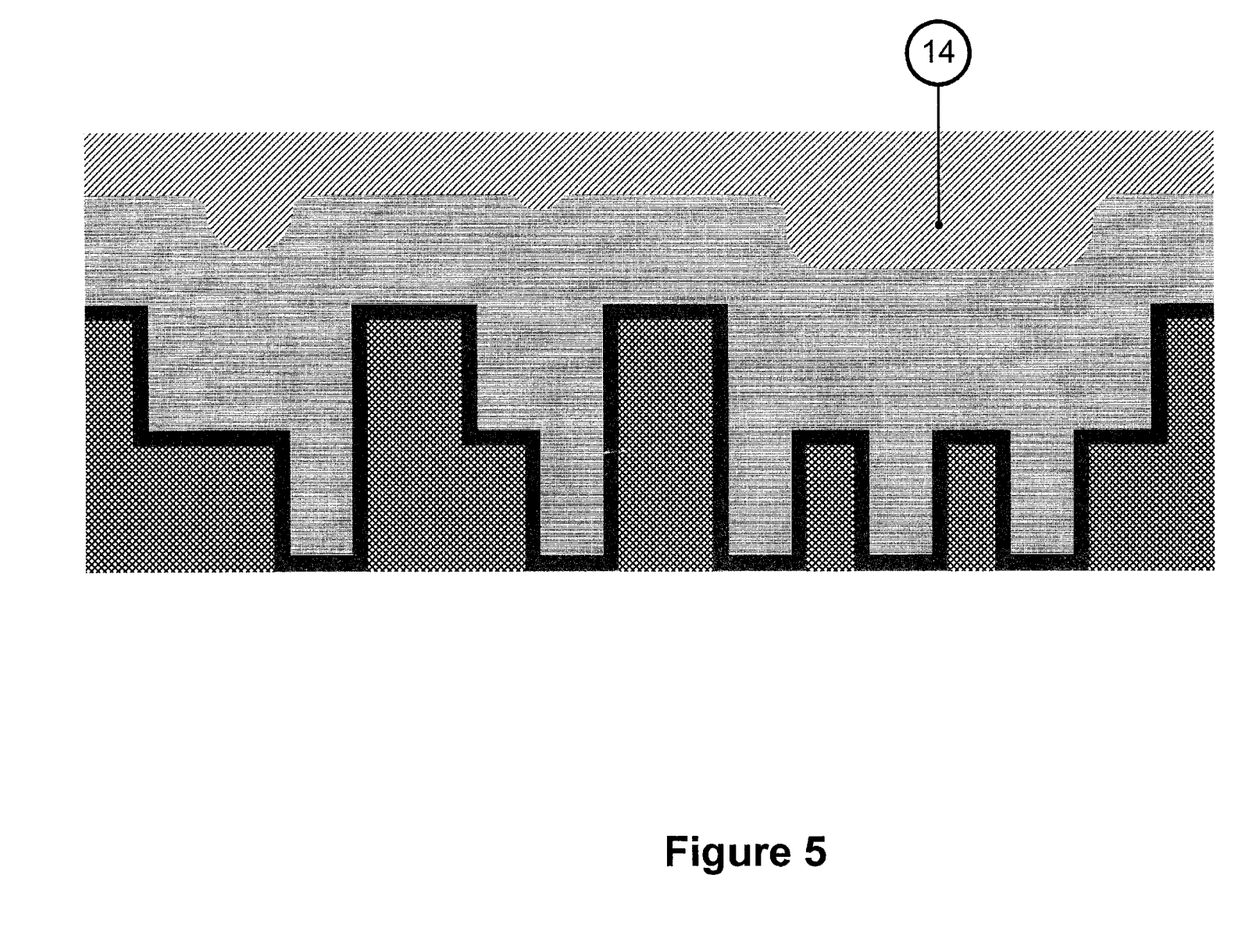
FIG. 5: Schematic cross-sectional view of typical damascene and dual damascene interconnects with surface topography prior to planarization including application of viscous overlayer completely covering the surface.

Some embodiments of the present invention utilize simultaneous introduction of protective fluid and etchant onto the wafer, typically while the wafer is spinning. A configuration of materials schematically depicted in FIG. 5 is the result. A fluid layer, 14 contains both etchant and viscous fluid in a mixture or dispersal. The more viscous fluid, typically more dense, will thus tend to concentrate at the lower regions of the fluid layer, 14, and in the depressed regions. Hence, simultaneous introduction of etchant and protective fluid leads to preferential concentration of protective fluid in the depressed surface regions, where it is needed.

Typical etchant solutions for removing copper are as follows in which % indicates % by volume of fully concentrated reagents:

Binary Reagents
I. Nitric Acid: 1%–20%, preferably 3%–10%
   Phosphoric Acid: remaining solution.
Ternary Reagents
I. Nitric Acid: 1%–20%, preferably 3%–10%
   Sulfuric Acid: 20%–50%
   Phosphoric Acid: remaining solution
II. Nitric Acid: 10%
   Acetic Acid: 40%
   Phosphoric Acid: 50%
III. Nitric Acid: 6%
   Acetic Acid: 24%
   Phosphoric Acid: 70%

Hydrogen peroxide can be used to replace nitric acid in whole or in part in the above etchant mixtures.

Following etching, the residual etching reagents, protective fluid, etching by-products and the like are cleaned from the surface of the wafer in preparation for the deposition of additional layers of material. Post-etching cleaning is well-known in the art and described by Steigerwald et. al., supra pp. 289–305 among other references.

Additives

In some embodiments of the present invention, removal of copper leads to exposure of the barrier layer and the removal of overlayers, resulting in the configuration of FIG. 3B. At this point, it is necessary to remove the barrier layer, 2, while retaining planarity of the copper layer, that is, avoid dishing. Removal of the barrier layer, Ta/TaN typically requires rather aggressive chemical etchants such as hydrofluoric acid, ammonium fluoride, ammonium bromide among others Such aggressive etchants may etch the copper, or etch the copper at a faster rate than the barrier layer, resulting in dishing. Thus, selective protection of the copper in comparison with the barrier layer is useful in these embodiments of the present invention.

One approach to the avoidance of dishing is to introduce selective additives into the etching solution that selectively adsorb onto the copper. The adsorbed species are chosen to protect copper from further etching while permitting removal of the barrier layer to proceed. The additives (typically organic compounds) adsorb at locations of high surface energy and are known in the electroplating field as "suppressors" or "inhibitors" tending to retard copper deposition at the adsorption sites. Similar effects occur for hindering dissolution of the copper. Such additives must be compatible with the etchant (that is, not destroyed or rendered ineffective in the presence of etchant). Typical additives include sulfonic acid type additives, glycols or other additives compatible with the typical etchant bath (for example, phosphoric acid).

The planarization techniques described herein may be augmented by the application of external voltages to the copper and to the electrolytic etchant solutions, thereby adding electrochemical effects to the chemical and mechanical planarization effects described herein.

The etching procedures described herein result in improved methods for the planarization of Cu/Ta/TaN layers in the fabrication of ICs. Improved performance of the resulting IC and/or improved process throughput result.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described.

We claim:

1. A method of planarizing a metal surface in the fabrication of integrated circuit interconnects comprising:

providing a protecting fluid that comprises passivating metal, copper or a chemically inhibiting compound;

introducing the protecting fluid onto the metal surface, wherein the metal surface comprises at least one lower region;

dispersing the protecting fluid across the metal surface;

allowing the protecting fluid to settle into the at least one lower region;

introducing an etching solution onto the metal surface, whereby the viscosity of the protecting fluid exceeds that of the etching solution thereby hindering etching of the surface in regions of the surface occupied by the protecting fluid; and, then etching the metal surface to planarity.

2. A method as in claim 1 wherein said protecting fluid lacks oxidants capable of etching said metal surface.

3. A method as in claim 2 wherein said introduction of said protecting fluid onto said metal surface is in sufficient quantity to provide protection to depressed regions of said metal surface.

4. A method as in claim 3 wherein said protecting fluid contains dissolved therein a saturating amount of ion of the metal that comprises the metal surface.

5. A method as in claim 4 wherein said metal is copper.

6. A method as in claim 5 wherein said protecting fluid is phosphoric acid containing a saturating amount of copper ions dissolved therein.

* * * * *